United States Patent [19]
Kaneko et al.

[11] Patent Number: 5,178,638
[45] Date of Patent: Jan. 12, 1993

[54] PRESSURE-REDUCED CHAMBER SYSTEM HAVING A FILTER MEANS

[75] Inventors: Satoshi Kaneko, Yokohama; Taichi Fugita, Yamato; Yukimasa Yoshida; Katsuya Okumura, both of Yokohama, all of Japan

[73] Assignees: Tokyo Electron Limited, Tokyo; Kabushiki Kaisha Toshiba, Kawasaki, both of Japan

[21] Appl. No.: 732,911

[22] Filed: Jul. 19, 1991

[30] Foreign Application Priority Data

Jul. 20, 1990 [JP] Japan ................................ 2-192466

[51] Int. Cl.$^5$ .......................................... H01L 21/68
[52] U.S. Cl. ................................ 29/25.01; 118/50.1
[58] Field of Search ................................ 29/25.01, 759; 134/104.2, 152, 153, 902; 118/500, 326, 50.1

[56] References Cited

U.S. PATENT DOCUMENTS

| | | | |
|---|---|---|---|
| 4,500,407 | 2/1985 | Boys et al. | 204/298.25 |
| 5,080,549 | 1/1992 | Goodwin et al. | 901/30 |

FOREIGN PATENT DOCUMENTS

| | | |
|---|---|---|
| 60-120520 | 6/1985 | Japan . |
| 60-183736 | 9/1985 | Japan . |
| 61-71383 | 4/1986 | Japan . |
| 61-9345 | 5/1986 | Japan . |
| 61-87351 | 5/1986 | Japan . |
| 61-90887 | 5/1986 | Japan . |
| 61-90903 | 5/1986 | Japan . |
| 61-99344 | 5/1986 | Japan . |
| 61-278149 | 12/1986 | Japan . |
| 62-16167 | 1/1987 | Japan . |
| 62-21644 | 1/1987 | Japan . |
| 62-21649 | 1/1987 | Japan . |
| 62-41129 | 2/1987 | Japan . |
| 62-150735 | 7/1987 | Japan . |
| 62-161608 | 7/1987 | Japan . |

*Primary Examiner*—Olik Chaudhuri
*Assistant Examiner*—David E. Graybill
*Attorney, Agent, or Firm*—Oblon, Spivak, McClelland, Maier & Neustadt

[57] ABSTRACT

The pressure-reduced chamber system of the invention includes a handling mechanism for loading and/or unloading a semiconductor wafer between a process chamber in which a plasma etching is carried out on a semiconductor wafer under a reduced pressure, and a pressure-reduced chamber. Further, the system includes an outer cover for covering the driving force transmitting section of the handling mechanism, a filter mounted to the outer cover such that it defines the inside and outside of the outer cover, and an exhaustion pump for evacuating the space region formed between the outer cover and the pressure-reduced chamber. Thus, when the space region is evacuated by the exhaustion pump, the dust generated from the driving force transmitting section of the handling mechanism is caught by the filter.

7 Claims, 5 Drawing Sheets

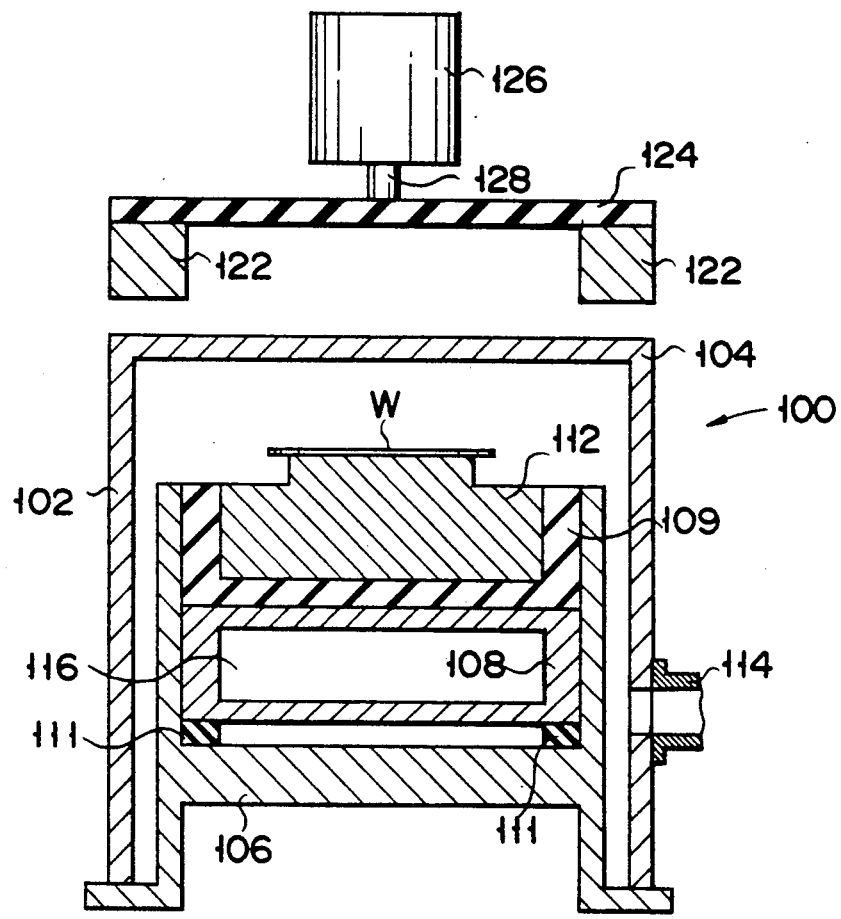
F I G. 2

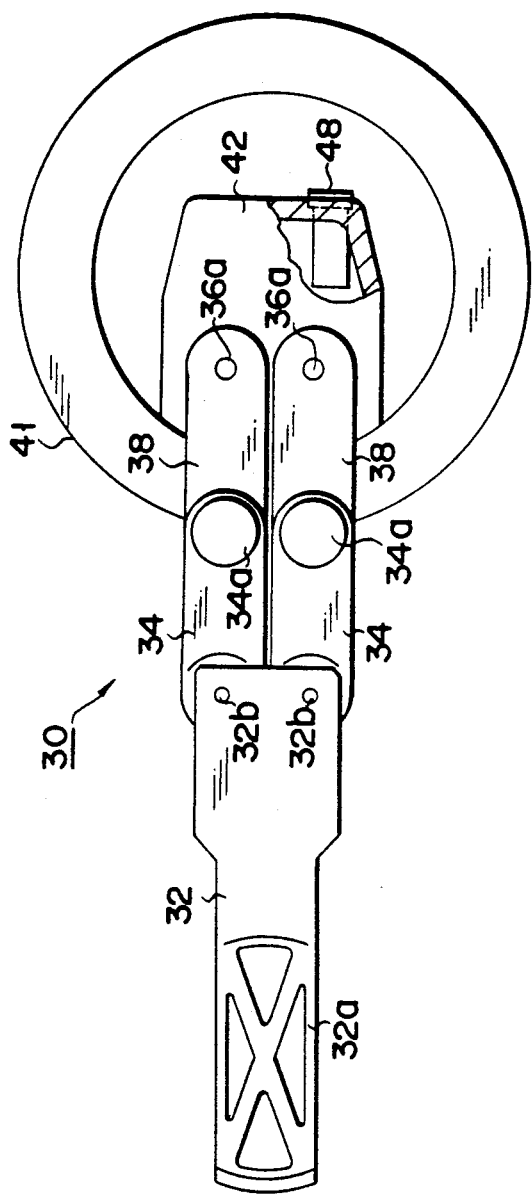
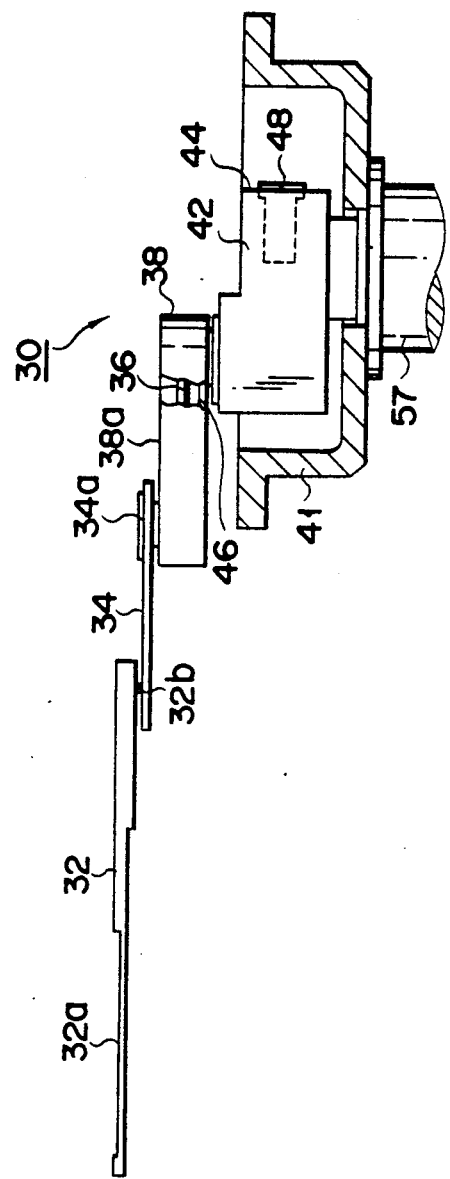
FIG. 4
FIG. 5

PRESSURE-REDUCED CHAMBER SYSTEM HAVING A FILTER MEANS

BACKGROUND OF THE INVENTION

1. Field of the Invention

The present invention relates to a pressure-reduced chamber system for loading/unloading an object to/from a process chamber, and more specifically to a load lock chamber including a loading/unloading mechanism for loading/unloading a semiconductor wafer to/from the process chamber of a magnetron plasma etching device.

2. Description of the Related Art

A process chamber, for example, for etching a semiconductor wafer under a reduced pressure, has a load lock chamber at each of the entrance and exit thereof, through which the wafer is loaded and/or unloaded. The load lock chamber is communicated to an exhausting device so that the pressure in the load lock chamber is reduced to the same level as the inner pressure of the process chamber in a short period of time. Further, a handling device for loading/unloading the semiconductor wafer to/from the process chamber is housed in the load lock chamber.

Load lock chambers having such a handling device are disclosed in Published Unexamined Japanese Patent Applications Nos. 54-10976, 62-16167, 61-278149, 62-150735, 62-21644, 60-120520, 60-183736, 62-21649, 62-161608, 61-99345, 61-99344, 61-90903, 61-90887, 61-87351, 61-71383 and 62-41129. The handling devices set forth in these documents include expansible multi-joint arms and a driving mechanism therefor.

The driving mechanisms of these handling devices include a number of mechanisms such as a gear, belt, pulley, and the like, and as these mechanisms slide with each other with some inevitable friction, fine particles are generated therefrom. If these fine particles generated from the mechanisms are scattered in the load lock chamber, some of them are accumulated on the surface of a wafer, and/or even come into the process chamber, thereby disturbing the process of the wafer in the process chamber. In order to avoid such a problem, the mechanisms for driving arms are usually housed in dust protective casings.

However, in the conventional devices, when the inner pressure of the load lock chamber is being reduced from that of the atmosphere to that set for the process, the dusts generated from the driving mechanisms leak out from the casing. In this case, it is not possible to completely remove the leaking dust from the load lock chamber; therefore some of the dust flow into the process chamber from the load lock chamber, and accumulate on the wafer, rendering the wafer a defective product.

SUMMARY OF THE INVENTION

The present invention has been proposed in consideration of the above-described problem, and the purpose thereof is to provide a pressure-reduced chamber system including an object loading/unloading mechanism with which the contamination of the atmosphere in the process is prevented, and accordingly the product yield is enhanced In order to achieve such a purpose, the present invention is designed such that contaminator such as dusts generated from the mechanisms are prevented from being scattered in the pressure-reduced chamber.

To be more specific, according to an aspect of the invention, there is provided a pressure-reduced chamber system for loading/unloading an object to/from a process chamber in which the object is processed under a reduced pressure, comprising a pressure-reduced chamber communicated/discommunicated to/from said process chamber, an object load/unload mechanism; located in said pressure-reduced chamber, for transferring the object between said pressure-reduced chamber and said process chamber, an outer cover for covering a driving force transmitting section of said load/unload mechanism, filter means, provided for said outer cover, for communicating an inside of said outer cover to an outside thereof, and vacuum exhausting means for evacuating a space region which is formed between the outer cover of said load/unload mechanism and said pressure-reduced chamber.

With this structure, contaminator generated from the driving force transmitting section of said load/unload mechanism when said space region is being evacuated by said vacuum exhausting means, are caught by means of the filter means. Thus, particles or dust generated from the driving force transmitting section of the load/unload mechanism are prevented from being scattered outside the outer cover, and they do not leak into the process chamber from the load lock chamber when the load lock chamber is communicated to the process chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a schematic view of a whole cross section of a process chamber;

FIG. 4 is a plan view of the handling device from the top;

FIG. 5 is a side view of a part of the handling device in cross section;

DETAILED DESCRIPTION OF THE PREFERRED EMBODIMENTS

An embodiment of the present invention, in which a pressure-reduced chamber (load lock chamber) of the invention is employed in a magnetron plasma etching device, will now be explained with reference to accompanying drawings.

Figure 1:
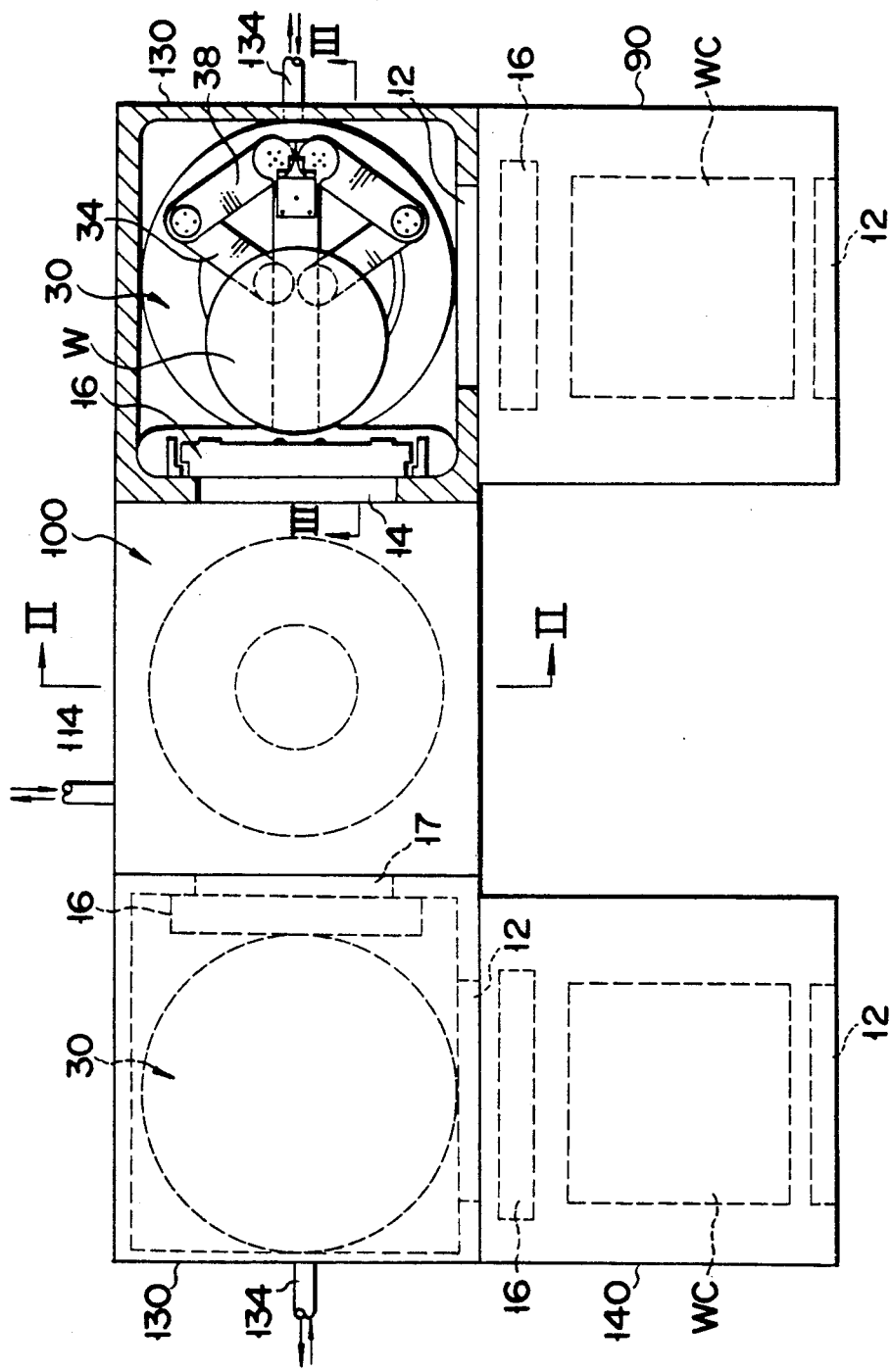
FIG. 1 is a layout diagram showing the entire body of a magnetron plasma etching system in which a load lock chamber is built in as a pressure-reduced chamber system according to the present invention.

As can be seen in FIG. 1, an entrance 14 for loading a wafer W therein, and an exit 17 for unloading the wafer W therefrom are provided in a side wall and one opposing thereto, of a process chamber 100, respectively. The first load lock chamber 130 is located on the side of the entrance 14 of the process chamber 100, and on the side of the exit 17, the second load lock chamber 130 is set.

Further, a loading section 90 is located on another side of the first load lock chamber 130 such that a side surface of the loading section 90 meet that side of the first load lock chamber 130, whereas an unloading section 140 is located on another side of the second load lock chamber 130 in the same manner as that of the loading section 90. With this structure, a single wafer cassette WC is loaded to the loading section 90, or unloaded to the unloading section 140 by arm means of a robot (not shown). It should be noted here that the wafer cassette WC can carry 25 silicon wafers at the same time, and each of openings 12 and 14 provided between the first load lock chamber 130 and the loading section 90, and between the first load lock chamber 130 and the process chamber 100, respectively, is opened/closed by means of a gate block of a toggle type gate device.

A handling device 30 is provided in each of the first and second load lock chambers 130s, and with which the wafer W is loaded to or unloaded from the process chamber 100.

As can be seen in FIG. 2, an RIE type etching device is housed in the process chamber 100. A housing 102 of the process chamber 100 consists of an upper and lower frames 104 and 106, respectively. Further, a susceptor 112, which is insulated from the surroundings by an insulating frame 109, is placed on the lower frame 106, whereas the upper frame 104 is grounded. Since the susceptor 112 is supplied with an RF power, the upper frame 104 and the susceptor 112 make opposite parallel electrodes by themselves.

Furthermore, above the top surface of the upper frame 104, at a position where it is opposite to the wafer W on the susceptor 112 with respect to the frame 104, there is located a disk 124 on the bottom surface of which permanent magnets 122 are arranged. A shaft 128 of a motor 126 is mounted on the top surface of the disk 124. As the permanent magnets 122 arranged on the disk 124 are rotated by the motor 126, a magnetic field running in parallel with the wafer is generated at a position close to the wafer W.

An etching gas contained in the process chamber 100 is exhausted predetermined speed passing through an exhaustion pipe 114 by an exhaustion pump (not shown). For example, the inner pressure of the process chamber 100 is thus reduced until it falls in the range defined between $10^{-2}$–$10^{-3}$ Torr. The etching gas is ionized into plasma between the above-mentioned electrodes opposing to each other. Therefore, magnetron discharge generate in low pressure condition. In magnetron plasma etching, electrons behaves in a cycloid movement manner due to the reciprocal interaction between the magnetic field and the electrical field of the plasma sheath which run perpendicular thereto; thereby increasing the number of the ionizations of molecules, which are caused when the electrons collide with the molecules. Thus, a high etching speed can be obtained despite such a low pressure as described.

In addition, a cooling jacket 108 is set within a conductive plate of lower side of the insulating frame 109, and liquid nitrogen is supplied through a passage 116 of the cooling jacket 108 from a liquid nitrogen supplying source (not shown), so as to cool the wafer W placed on the susceptor 112 at a temperature as low as $-60°$ C. while the wafer is being processed.

Figure 3:
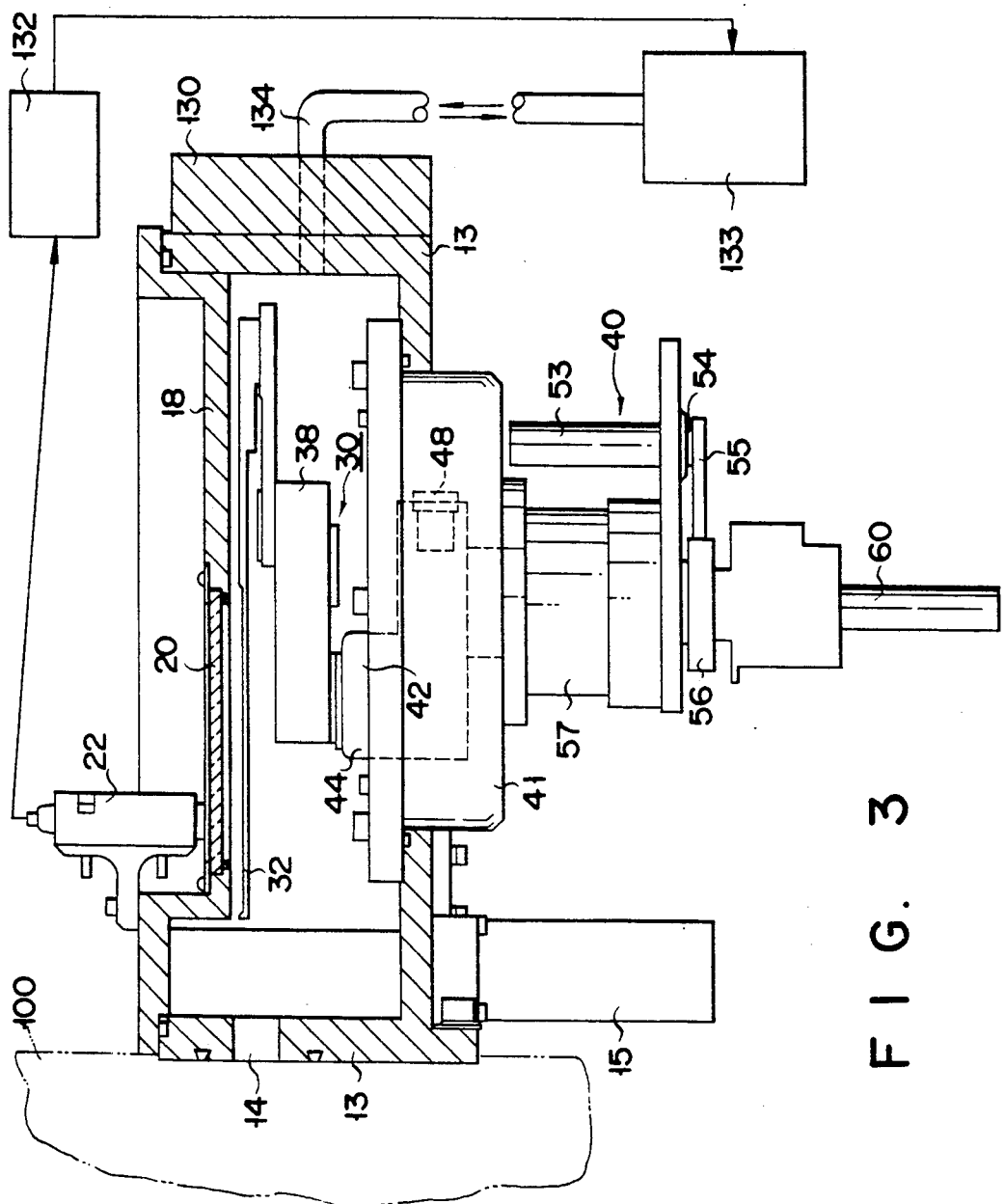
FIG. 3 is a schematic view of a whole cross section of a load lock chamber including a handling device.

As is shown in FIG. 3, a top lid 18 is put on a lower frame 13 in order to maintain the hermetically state of the inside of the load lock chamber 130, and a pipe 134, which is pierced through a side wall of the load lock chamber 130 to connect this chamber to an exhaustion device 133, is designed to exhaust the gas contained in the chamber until the inner pressure thereof is reduced to a point within the range between $10^{-2}$–$10^{-3}$ Torr. The exhaustion device 133 includes a nitrogen gas supplying source (not shown) therein, and serves also to supply nitrogen gas into the chamber 130 via the pipe 134.

That side wall of the load lock chamber 130, which meets with that of the process chamber 100 has a gate opening 14, through which the wafer W is loaded/unloaded between the load lock chamber 130 and the process chamber 100. The gate opening 14 is always closed by a gate block 16 except that when the wafer W is loaded/unloaded, the gate block 16 is withdrawn into a case 15 located underneath, thus opening the gate opening 14. As the gate opens, a top arm 32 of the multi-joint arm of the handling device 30 comes through the gate opening 14 into the process chamber 100.

On a part of the top lid 18 of the load lock chamber 130, there is provided an observation window 20 which is made of, for example, transparent quartz or the like. Further, a reflection-type beam sensor 22, for example, is placed above the observation window 20 for the purpose of checking existence of the wafer W. This reflection-type beam sensor 22 is designed to check whether or not a wafer W is placed at a predetermined position in the chamber 130. The beam sensor 22 is connected to the input portion of a controller 132, and the output portion of the controller 132 is further connected to the power of the driving section for the exhaustion device 133.

The handling device 30 is constituted as a single unit, and when a bracket 41 is removed from a frame 13 of the chamber 130, the handling device 30, the bracket 41, and a driving section 40 thereof are all dismounted from the chamber 130 as an integral body.

A driving force transmitting section 42 is put through the bottom portion of the bracket 41, and further extends downward. The lower portion of the driving force transmitting section 42 is covered by a dust protective cap 57. The driving shaft in the cap 57 is sealed its clearance with magnetic fluid. A main shaft of the driving force transmitting section 42 is engaged with the driving shaft of a motor 60 located underneath. It should be noted that a pulley 56 is fixed in an appropriate part of the dust protective cap 57, and a belt 55 is suspended over a pulley 54 of a motor 53 and the pulley 56 connecting them with each other. Multi-joint arms 32, 34, and 38 located above these mechanisms are rotated around the main shaft 60 along with the driving force transmitting section 42 by means of this belt driving mechanism.

Figure 6:
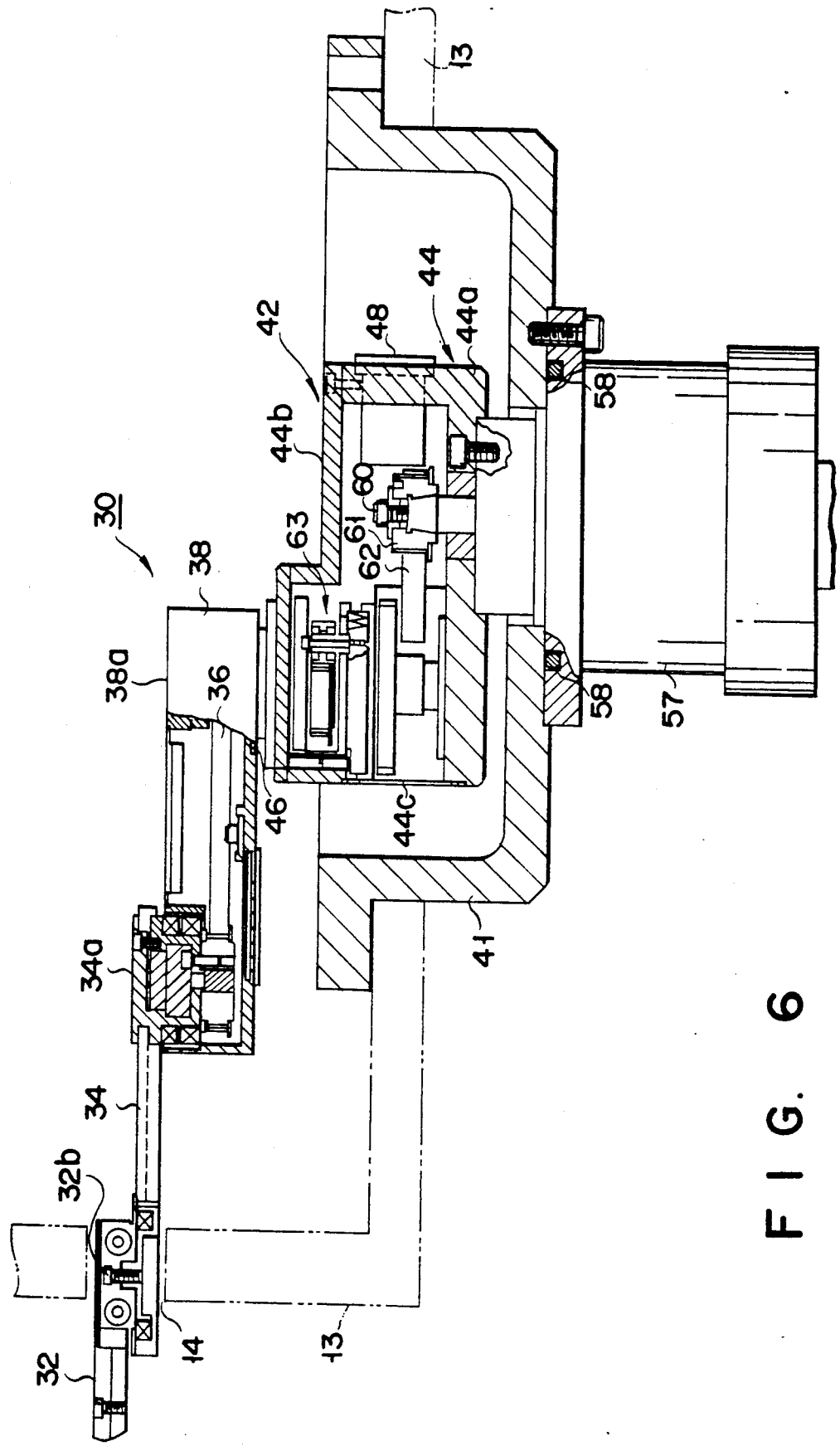
FIG. 6 is a side view of the whole handling device in cross section.

The following is an explanation of the upper section of the handling device 30 with reference to FIGS. 4–6.

As can be seen in FIG. 4, the handling device 30 has a structure of a frog-leg type, and employs the multi-joint arms 32, 34, and 38. This figure shows a situation in which the multi-joint arms 32, 34, and 38 are fully stretched. Here, it should be recalled that the fully contracted situation of the multi-joint arms 32, 34, and 38 are depicted in FIG. 1. The multi-joint arms of the handling device 30 consist of a pair of the first arms 38, a pair of the second arms 34, and the top arm 32. Further, the arms 32, 34, and 38, and the driving force transmitting section 42 are engaged with each other by means of shafts 32b, 34a, and 36b.

As is shown in FIG. 5, one end of the first arm 38 is engaged with the upper portion of the driving force transmitting section 42 by the shaft 36a, and one end of the second arm 34 is engaged with the other end of the first arm 38 by the shaft 34a. Further, one end of the top arm 32 is engaged with the other end of the second arm 34 by the shaft 32b. A wafer plate 32a on which a wafer W is placed is formed at the free end of the top arm 32. The drive mechanism of the first arm 38 is covered by a cover 38a, and the internal mechanism (belt 36 etc.) of the driving force transmitting section 42 is covered by a cover 44.

In addition, the multi-joint arms 32, 34, and 38, the driving force transmitting section 42, and the bracket 41 are good conductors, and the bracket 41 in particular is grounded so as to discharge the electrostatic energy on the wafer W. Thus, the top arm 32 is effectively prevented from being charged up, which causes the attracting of dust.

The transmitting mechanism of the driving force via the first driving pivots 36a and 36a, and the second driving pivots 34a and 34a will now be described.

The driving force generated from a motor (not shown) located below the force transmitting section 42 is propagated thereto. The driving force transmitting section 42 is covered by a cover 44, and includes a belt transmission mechanism and a gear driving mechanism, and the like, therein. In an arm cover 38a which covers the first arm 38 described above, there is a mechanism for rotating the first driving pivots 36a and 36a themselves, and a driving mechanism for transmitting the rotating force to the second driving pivots 34a and 34a. For transmitting this force, a belt transmission mechanism, for example, is employed. The driving force transmitting section 42, and the first arm 38 are engaged with each other by the internal driving force transmitting mechanism. Consequently, the cover 44 mentioned above, and the mechanism in the arm cover 38a are connected with each other. It should be noted that materials for the covers 38a and 44 can be metal plates such as an aluminum plate and stainless steel plate, or can be non-metal plates such as a ceramic and resin.

As is shown in FIG. 6, an O-ring 58 is inserted between the bracket 41 and the dust protective cap 57. Thus, dusts cannot come into the chamber 130 from the outside.

The following is a brief description of the internal structure of the driving force transmitting section 42.

A pulley 61 is fixed in the upper end portion of the main shaft 60, and a belt 62 is suspended over the pulley 61 and the pulley of the driving force dividing mechanism 63. The driving force dividing mechanism 63 includes a number of gears, and serves to transmit the rotational forces working in opposite directions to each other to both of the first arms 38. The surface of each of the gears is coated with TiN, and a molybdenum disulfide layer is formed thereon by spattering. In addition, the cover 44 consists of a lower cover 44a, an upper cover 44b, and a window cover 44c.

In order to make an arm cover 38a movable with respect to the cover 44, a joint portion 46 therebetween is sealed with a magnetic fluid.

The following is an explanation of a filter 48 mounted on the cover 44 of the driving force transmitting section 42.

A cutout is formed in a part of the aluminum cover 44, and the filter 48 is detachably mounted to the cutout. An element 51 of the filter 48 is, for example, a paper filter, or the like. The diameter of the mesh opening of the filter element 51 should preferably be in the range between 0.05–0.15 $\mu$m, and most preferably be 0.10 $\mu$m.

Figure 7:
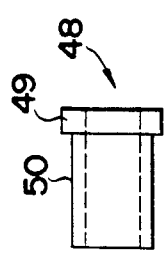
FIG. 7 is a side view of a detachable filter.
Figure 8:
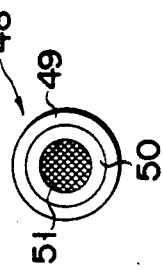
FIG. 8 is a front view of the detachable filter taken from the end surface of the suction side.

As can be seen in FIGS. 7 and 8, a flange 49 of the filter 48 is engaged with the cover 44, and the body 50 is inserted to the cover. The hollow sections of the body 50 and the flange 49 are filled with paper filter materials. It should be noted that the filter 48 can be fixed to the cover 44 by any of screw stopper, screw-in, and fit-in methods.

The operation and the effect of the invention will now be explained in detail.

Reception of the wafer W from the loading section 90, and transmission of the wafer to the process chamber 100 are carried out by the handling device 30. During these operations, generation of dust is inevitable in the driving section of the handling device 30, more specifically, in the first arm 38 and the driving force transmitting section 42, due to the wearing-out of the friction surfaces of the mechanism involved such as the engaged teeth of the gears, and the contact portions between the belt and the pulleys. Further, prior to the reception of the wafer W from the loading section 90, the inside of the load lock chamber 130 is opened to the atmosphere, and then after the reception, the chamber 130 is evacuated. Therefore, the internal status of the load lock chamber 130 reciprocates between the vacuum and the atmosphere. Since it is not possible to completely close the first arm 38 and the driving force transmitting section 42 by the arm cover 38a and the cover 44, and therefore the dust generated in the various sections is likely to be scattered in the load lock chamber 130 via gaps.

In this embodiment, the filter 48 is provided at a part of the cover 44 of the driving force transmitting section 42. Since the filter 48 is located at a passage through which dust can leak from the inside of the driving force transmitting section 42 into the load lock chamber 130, the filter can catch the dusts flowing out of the driving force transmitting section 42 upon evacuation thereof, particularly when the load lock chamber 130 is evacuated.

Further, since the driving force transmitting section 42 and the first arm 38 are internally connected with each other, when the load lock chamber 130 is evacuated, the first arm 36 is also evacuated via the force transmitting section 42. Consequently, the dust generated from the mechanism of the first arm 38 can be also caught by the above-mentioned filter 48. In order to further increase the efficiency of the filter for catching the dust from the first arm mechanism, a joint movable portion 46 between the arm cover 38a and the cover 44 is sealed with a magnetic fluid. Thus, the above-described section can be made completely hermetic and an exhaustion passage running from the first arm 38 to the driving force transmitting section 42 is formed.

Incidentally, the magnetic fluid used for sealing the joint movable portion 46 can also serve to prevent generation of dusts from the sealed portion itself.

Since the filter 48 is made detachable from the cover 44, it can be replaced after processing a certain number of wafers W or being used for a certain time period; therefore a desired filtering efficiency can be obtained at any time.

As described, the dust generated in the driving force transmitting section can be caught by the filter 48; therefore the interior cleanness of the load lock chamber 130 can be maintained at a desired level, and that of the process chamber 100, which is connected thereto, can be improved. Consequently, the product yield, as of wafers W, can be significantly increased.

It should be noted here that the present invention is not limited to the above-described embodiment, but can be remodeled into a variety of uses within the scope of the main feature thereof.

This embodiment is directed to a case where the invention is applied for an etching device; however the invention can be applied for any type of devices as long as they are involved in process under a reduced pressure such as a spattering apparatus, a CVD apparatus, an ion implantor or a bach type plasma processing apparatus.

Further, the handling device 30 is not limited to the one in which a loading arm of the frog-leg type is employed, but various types of loading arms can be also used.

As explained, according to the present invention, even if a loading device is located in a vacuum chamber, contaminator, for example, dust generated from the driving section of the loading device, can be caught by means of a filter. Thus, the foreign materials are not scattered in the vacuum chamber, and therefore the yield of product can be improved. Further, when catching the dust by the filter, a vacuum exhaustion source, which is provided for another purpose, can be utilized to evacuate the vacuum chamber, thereby maintaining the structure of the whole system very simple.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A pressure-reduced chamber system for loading-/unloading an object to/from a process chamber in which the object is processed under a reduced pressure, comprising:

a pressure-reduced chamber communicated/discommunicated to/from said process chamber;

an object load/unload mechanism, located in said pressure-reduced chamber, for transferring the object between said pressure-reduced chamber and said process chamber;

an outer cover for covering a driving force transmitting section of said load/unload mechanism;

filter means, provided for said outer cover, for connecting an inside of said outer cover to an outside thereof; and vacuum exhausting means for evacuating a space region which is formed between the outer cover of said load/unload mechanism and said pressure-reduced chamber;

whereby catching, by means of said filter means, a foreign material generated from the driving force transmitting section of said load/unload mechanism when said space region is being evacuated by said vacuum exhausting means.

2. A pressure-reduced chamber system according to claim 1, wherein said load/unload mechanism has multi-joint arms which can extend/contract in an object-transferring direction as said multi-joint arms symmetrically move in a horizontal plane, a first arm of which is covered by an arm cover, and a joint portion connecting the arm cover and said outer cover with each other is sealed by a magnetic fluid.

3. A pressure-reduced chamber system according to claim 1, wherein said load/unload mechanism has multi-joint arms which can extend/contract in an object-transferring direction as said multi-joint arms symmetrically move in a horizontal plane, said multi-joint arms being made of conductive material and grounded such that an electrostatic charged up on said object is discharged therethrough.

4. A pressure-reduced chamber system according to claim 1, wherein said filter means is detachably mounted on a side wall of said outer cover.

5. A pressure-reduced chamber system according to claim 1, wherein said filter means has a paper filter as an element.

6. A pressure-reduced chamber system according to claim 5, wherein a mesh opening diameter of the element is 0.05–0.15 μm.

7. A pressure-reduced chamber system according to claim 1, further comprising gate means provided between said pressure-reduced chamber and said process chamber.

* * * * *